US009618580B2

(12) United States Patent
Warnock

(10) Patent No.: US 9,618,580 B2
(45) Date of Patent: Apr. 11, 2017

(54) DEBUGGING SCAN LATCH CIRCUITS USING FLIP DEVICES

(71) Applicant: INTERNATIONAL BUSINESS MACHINES CORPORATION, Armonk, NY (US)

(72) Inventor: James D. Warnock, Somers, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/706,354

(22) Filed: May 7, 2015

(65) Prior Publication Data

US 2016/0327608 A1   Nov. 10, 2016

(51) Int. Cl.
*H03K 3/289* (2006.01)
*G01R 31/3177* (2006.01)

(52) U.S. Cl.
CPC ................................ *G01R 31/3177* (2013.01)

(58) Field of Classification Search
None
See application file for complete search history.

(56) References Cited

U.S. PATENT DOCUMENTS

| 5,477,548 | A | 12/1995 | Beenker et al. |
| 5,881,067 | A | 3/1999 | Narayanan et al. |
| 6,380,780 | B1 | 4/2002 | Aitken et al. |
| 7,146,551 | B2 | 12/2006 | Ghisiawan et al. |
| 7,162,673 | B2 | 1/2007 | Wong |
| 7,590,906 | B2* | 9/2009 | Miwa ............... G01R 31/31854 714/726 |
| 8,412,991 | B2 | 4/2013 | Ackerman et al. |
| 2002/0078410 | A1* | 6/2002 | Matsushima .... G01R 31/31852 714/726 |
| 2009/0058484 | A1* | 3/2009 | Rao et al. .............. H03K 3/012 327/202 |

OTHER PUBLICATIONS

Hu et al., "Ternary Scan Design for VLSI Testability," IEEE Transactions on Computers, vol. C-35, No. 2, Feb. 1986, pp. 167-210.

Hsu, F. C., "Diagnostic Technique for Stuck Latch Defects in Shift Register String," IBM Technical Disclosure Bulletin (TDB 04-78, pp. 4731-4733), ip.com, IPCOM000069306D, Apr. 1978.

(Continued)

*Primary Examiner* — Long Nguyen
(74) *Attorney, Agent, or Firm* — Margaret A. McNamara, Esq.; Kevin P. Radigan, Esq.; Heslin Rothenberg Farley & Mesiti P.C.

(57) ABSTRACT

A latch circuit having a master latch and a slave latch includes a device used to short either the master latch or the slave latch. The device includes a transistor and a global control used to assert a signal, and is positioned to short an inverter of the master latch or the slave latch. When the signal is asserted by the global control, the inverter is shorted such that the output value of the inverter is the same as the input value. The assertion of the signal is facilitated by another device connected to the master latch and the slave latch that includes the global control and a transistor.

2 Claims, 9 Drawing Sheets

(56) References Cited

OTHER PUBLICATIONS

Narayanan et al., "An Efficient Scheme to Diagnose Scan Chains," International Test Conference, Pater 29.3, IEEE, Jul. 1997, pp. 704-713.
Warnock, James D., "Debugging Scan Latch Circuits Using Flip Devices," U.S. Appl. No. 14/869,719, filed Sep. 29, 2015, pp. 1-26.
List of IBM Patents or Patent Applications Treated as Related dated Mar. 15, 2016, pp. 1-2.
Warnock, James W., Office Action for U.S. Appl. No. 14/869,719, filed Sep. 29, 2015, dated Oct. 11, 2016 (8 pages).

* cited by examiner

US 9,618,580 B2

DEBUGGING SCAN LATCH CIRCUITS USING FLIP DEVICES

BACKGROUND

One or more aspects relate, in general, to debugging circuits, and in particular, to debugging scan latch circuits.

Failures in chains of conventional scan-only latches are very difficult to debug. This is because data is loaded into these chains through a serial scanning process. If the chain is broken, predictable values cannot be input into the latches which are downstream from the break. Thus, when scanning out and observing the output of the chain, it is not known when the first "wrong" value appears at the output (i.e., indicating the failing latch bit). That is, some, or all, of the latch bits downstream from the failing latch are initialized to the value set by the failing latch when scanning the chain. Therefore, the output just shows a steady stream of values set by the value of the latch bit stuck at a particular value making it difficult to determine which latch in the chain is the failed or broken latch.

Various solutions to the problem have been attempted, including using logic gates, such as exclusive OR gates, or other electronic devices, such as multiplexors, to debug the chain of latches. However, these solutions tend to be costly.

SUMMARY

Shortcomings of the prior art are overcome and additional advantages are provided through the provision of a latch circuit. The latch circuit includes, for instance, an input portion; a first circuit portion coupled to an output of the input portion; a second circuit portion coupled to the first circuit portion; an output portion coupled to an output of the second circuit portion; and a device coupled to at least one of the first circuit portion and the second circuit portion to selectively provide a short in one of the first circuit portion and the second circuit portion, the short to provide a particular latch state, the particular latch state to be used to provide an output state at the output portion to be used in debugging the latch circuit.

Methods and systems relating to one or more aspects are also described and may be claimed herein.

Additional features and advantages are realized through the techniques described herein. Other embodiments and aspects are described in detail herein and are considered a part of the claimed aspects.

BRIEF DESCRIPTION OF THE DRAWINGS

One or more aspects are particularly pointed out and distinctly claimed as examples in the claims at the conclusion of the specification. The foregoing and objects, features, and advantages of one or more aspects are apparent from the following detailed description taken in conjunction with the accompanying drawings in which:

DETAILED DESCRIPTION

Figure 1:
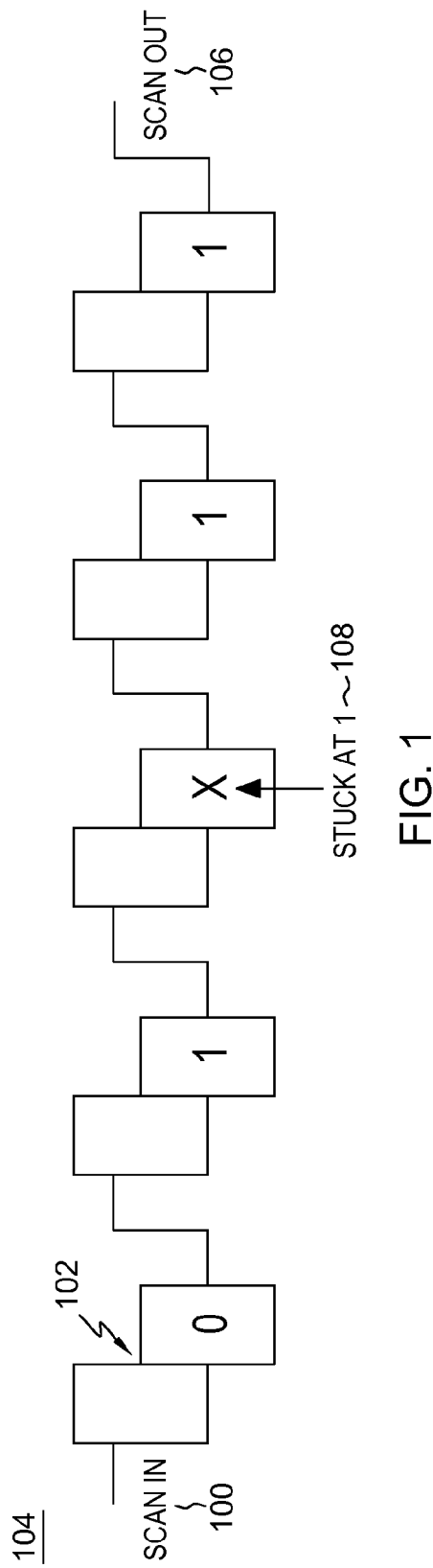
FIG. 1 depicts one example of a scan-only latch chain having a latch circuit in error.

In accordance with one or more aspects, a capability is provided for debugging latch circuits. The latch circuits may be used in integrated circuits, which may be included in many devices to provide processing capabilities, such as data processing systems, electronic devices, etc. The debug capability includes at least one device (e.g., a transistor) added to (e.g., coupled, electrically connected) the latch circuit to flip a bit of the latch circuit. After asserting the flip, the output of the latch circuit is examined to determine if an error exists. In particular, in one embodiment, the output of the latch circuit is examined relative to the output of other latch circuits in a chain of circuits (of which the latch circuit and the other latch circuits are a part) to determine if the latch circuit is in error.

Failures in chains of conventional scan-only latches are very difficult to debug. This is because data is loaded into these chains through a serial scanning process. If the chain is broken, predictable values cannot be input into the latches which are downstream from the break. Thus, on observing the output of the chain on scanning out, it is not known when the first wrong value appears at the output indicating the failing latch bit. This is because at least some of the latch bits downstream from the failing latch are initialized to the value set by the failing latch when scanning the chain. Therefore, the output shows a steady stream of values set by the value of the latch bit stuck at a particular value, referred to as a stuck latch bit.

In one example of a previous solution to determine which latch circuit of a latch chain is in error, the circuits of the failing latch chain are powered up from scratch, and then the initial pattern of outputs may reveal the failing latch. For instance, if the failing latch is stuck at 1, and most of the latch bits tend to power-up in a 0 state, then, when scanning out the chain after powering it up, most of the outputs are 0, until the value of the failing latch bit reaches the output, after which case everything is 1. Thus, it may be possible to determine the failure in that way. But, if the latches tend to power-on in a 1 state, then it may be impossible to find the failing latch in this way. Or, if the latch is a stuck at a 0 fail, then the latches would need to power up in a 1 state to be able to debug the fail. Therefore, at best, only one type of stuck at fault may be debugged in this way (i.e., stuck at 1 or stuck at 0). Furthermore, if latch bits tend to power-up to random, but repeatable states due to local parametric fluctuations, which is often the case, then the first latch in a steady stream of "1"s or "0"s (for stuck at 1 or stuck at 0 failures, respectively) may not be the failing latch. It may be downstream from the failing latch by some amount, but may just be powering up consistently in the same state as the actual failing latch. This makes it impossible to really know where the fail is located. This situation is shown in FIG. 1.

As shown in FIG. 1, data is scanned in 100 through a plurality of latches 102 of a latch chain 104. However, after the fault, only "1" is observed at the scan-out port 106 due to the stuck at one fault 108 in the chain. If, for example, some or all of the latch bits come up with a "1" on power-up, there is no way to determine where the fault is in the chain.

Figure 2:
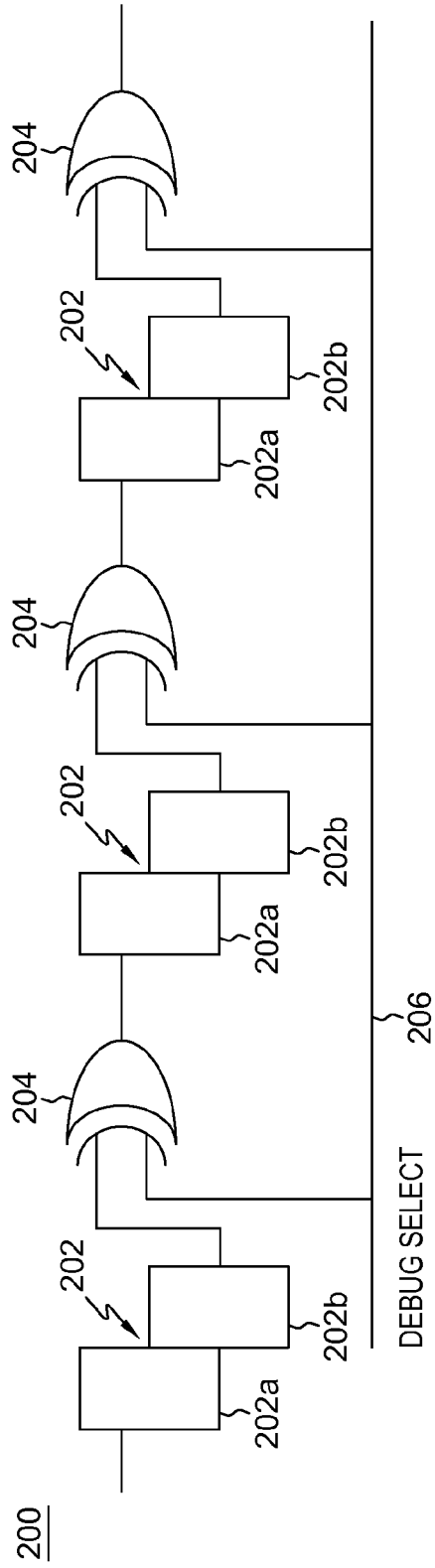
FIG. 2 depicts one example of a scan-only latch chain with debug capability.

In an attempt to solve this problem of trying to determine where the error is located within the chain, a debug capability is added to the scan chain. For instance, as shown in FIG. 2, a scan-only chain is depicted with an exclusive-OR (XOR) debug capability. As an example, a scan-only chain 200 includes a plurality of latch circuits 202, and each latch circuit is coupled to an XOR gate 204. Each latch circuit 202 includes for instance, a master latch 202a and a slave latch 202b connected serially to one another. In this example, the output of slave latch 202b is input to XOR gate 204, and the output of XOR gate 204 is input to master latch 202a of the next latch circuit 202 in the chain, and so on. Further, a debug select 206 is input to each XOR gate 204. In normal operation, debug select 206 is zero, and XOR gate 204 acts like a non-inverting buffer. However, when debug select 206 is set to one, XOR circuit 204 behaves as an inverter. Therefore, with debug select 206 set to one, if an upstream latch is stuck at one, and the chain downstream from that point is all ones, then one scan shift flips all those latches downstream from the broken one, to a value of zero, for debug. After this, setting debug select 206 back to 0, and shifting the scan chain values in the normal fashion, zeros will be observed at the output until the one from the failing latch reaches the output, thereby indicating where the failure occurred. The overhead for this solution is, for instance, nine transistors per latch to implement the XOR.

Figure 3:
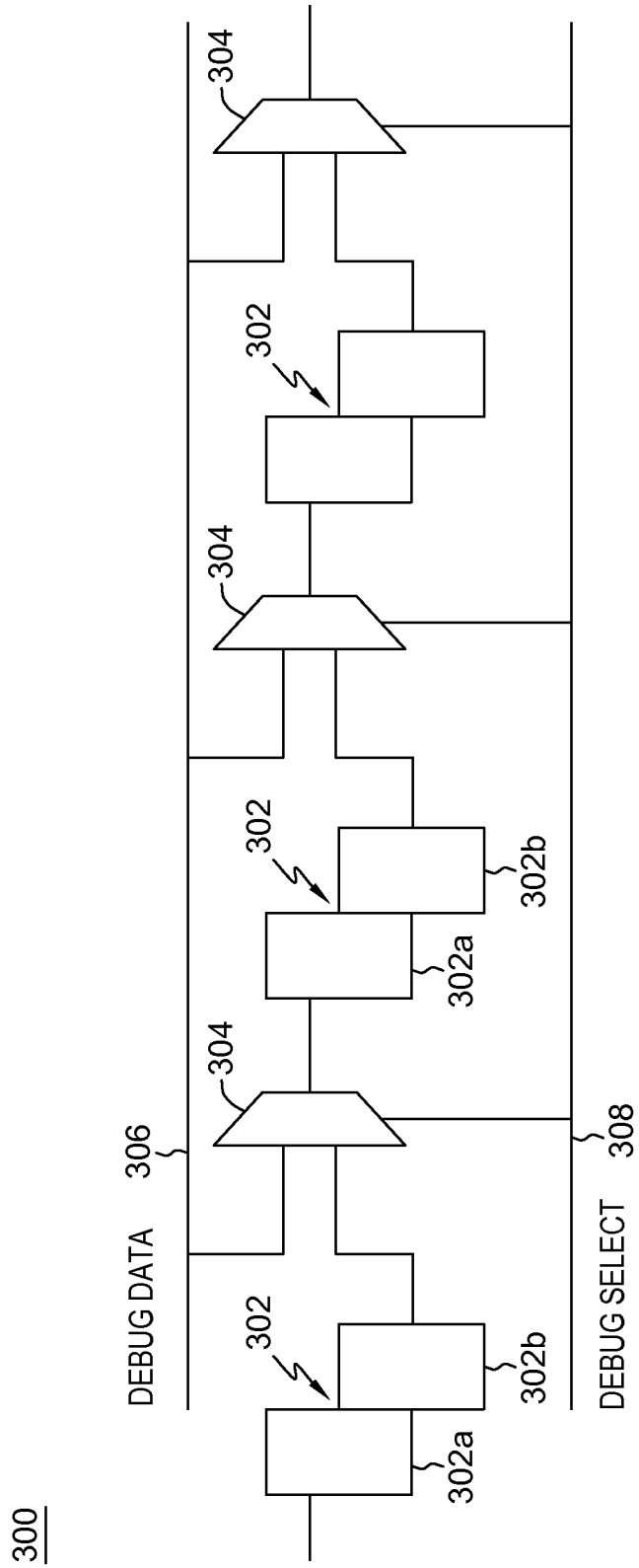
FIG. 3 depicts another example of a scan-only latch chain with debug capability.

In a further embodiment, the XOR gate is replaced with a multiplexor (mux), as shown in the example in FIG. 3. Referring to FIG. 3, a scan-only chain 300 includes a plurality of latch circuits 302, and each latch circuit is coupled to a mux 304. Each latch circuit includes for instance, a master latch 302a and a slave latch 302b. In this example, the output of slave latch 302b is input to mux 304, and the output of mux 304 is input to master latch 302a of the next latch circuit 302 in the chain, and so on. Further inputs to mux 304 include debug data 306, and a control input, referred to as debug select 308. Debug select 308 allows latches to be loaded with either a zero or a one (debug data) independently from the upstream value in the scan chain. However, overhead is generally about ten transistors for each latch bit (e.g., eight for the mux plus 2 to provide the complement value of the select signal) and two additional global signals which are to be routed to each bit.

Figure 4:
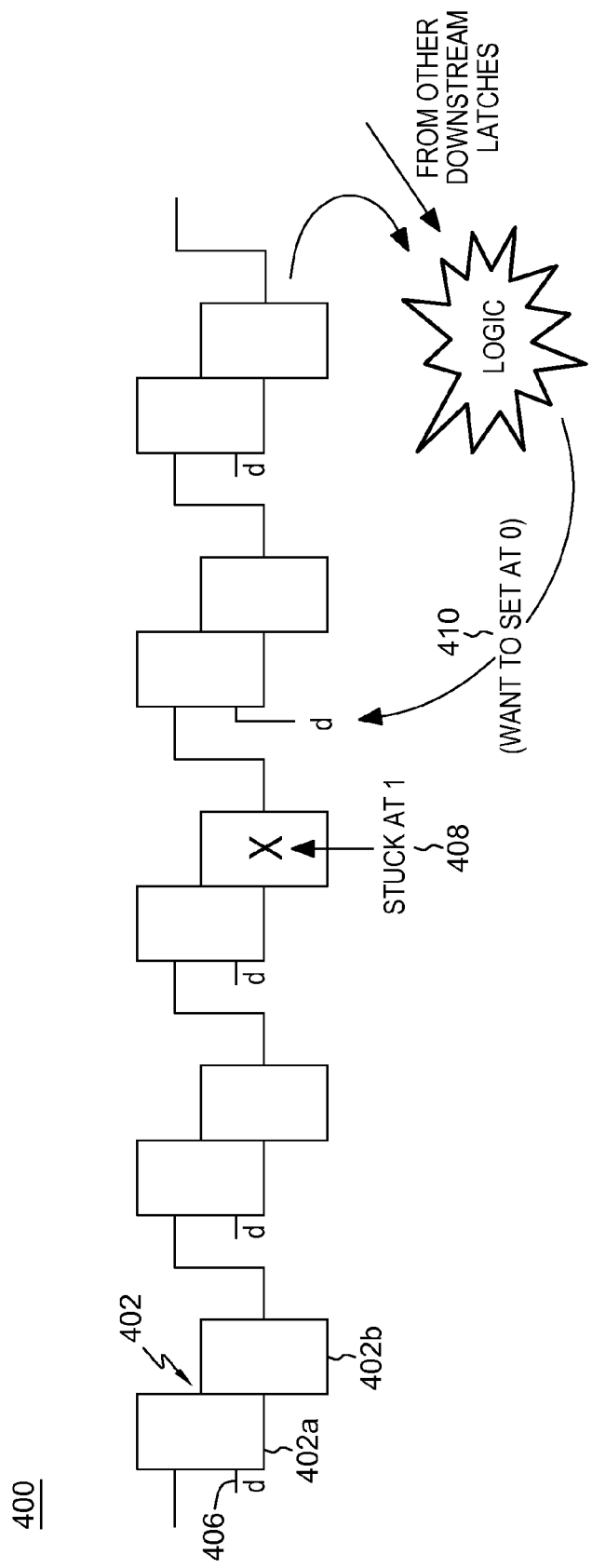
FIG. 4 depicts one example of scannable latches with data ports having a latch circuit in error.

In a further example, the latches may be scannable latches with data ports, as shown in FIG. 4. Referring to FIG. 4, a scannable latch chain with data ports 400 includes, for instance, a plurality of latch circuits 402 each having a data port 406. Each latch 402 includes a master latch 402a and a slave latch 402b. In this example, each master latch 402a includes a data port 406. As depicted, in this example, one of the latch circuits is in error 408. Thus, it is desirable to set the data port after the failed latch circuit to zero 410; however, this may not be possible, since values cannot be scanned in to initialize any latches below the faulty latch. The values from other downstream latches are unknown, and therefore, it may be impossible to set the desired bits to zero in order to debug the fail.

In accordance with one or more aspects, a capability is provided to debug latch circuits and latch circuit chains regardless of where the error is located in the circuit or the chain, regardless of the value of the stuck latch, and regardless of whether the latch circuits are scan-only or scan with data. Further, in accordance with one or more aspects, the debug capability is provided with low overhead. As one example, the capability includes short-circuiting a clock-controlled input stage to a latch. The capability includes flipping the latch state compared to the state that would be written into the latch if the clock had fired instead. This control is activated when the clock is inactive. Since one inverting logic stage is short-circuited at every latch input, the effect is that latch bits are flushed to alternate ones and zeros, starting from the first latch input. Therefore, in one example, if the input to a chain of latches is a 1, then with the flip control activated, the first latch would have its state flushed to 0 (i.e. inverting the input), the second would be flushed to 1, the third to 0, etc. If there is one latch bit which is stuck at a particular value, the next bit in the chain will be set to the alternate value, followed by alternating latch states to the end of the chain. On scanning out the latches, the fault can be easily isolated by observation of the point at which the data pattern at the output changes from alternating 1 and 0, to just a constant value, set by the stuck latch.

In one implementation, when the control bit is activated, the latch bit flips the state, given that its input is consistent with the state stored in the latch. The overhead can be as small as just two transistors per master-slave latch pair (instead of 10 for the scan mux solution) and just one global signal, instead of two. One particular example of an implementation of this debug functionality with a standard master-slave scan-only latch is described with reference to FIG. 5.

Figure 5:
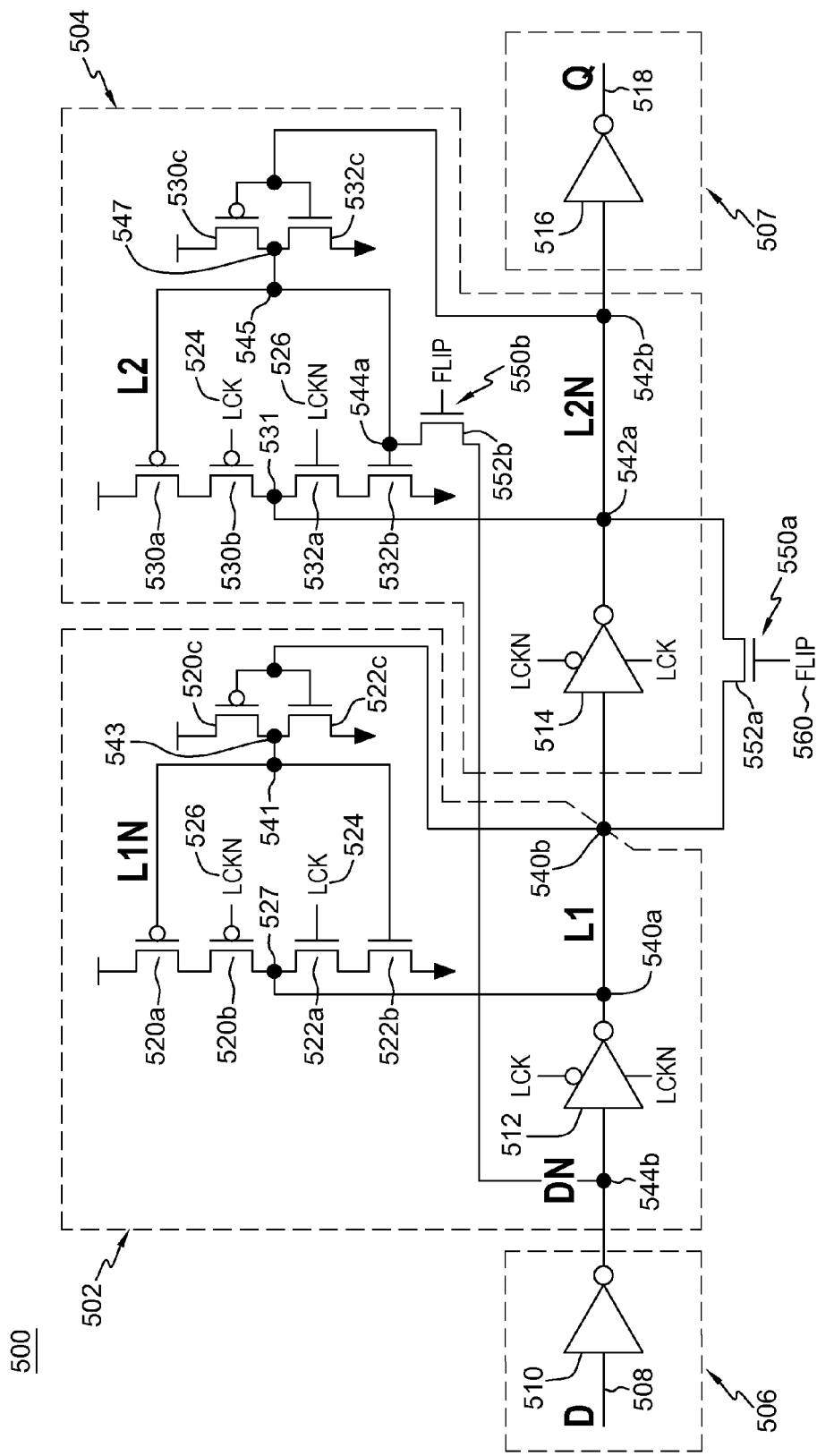
FIG. 5 depicts one example of a latch circuit including a device to debug the latch circuit, in accordance with one or more aspects.

Referring to FIG. 5, a latch circuit 500 includes a first circuit portion 502 coupled to a second circuit portion 504. In one particular example, first circuit portion 502 is a master latch electrically connected to second circuit portion 504, which is a slave latch. Latch circuit 500 further includes an input portion 506 and an output portion 507. Input portion 506 includes, for instance, a data input 508, which is input to an inverter 510; and output portion 507 includes, for instance, an inverter 516 and an output 518 of inverter 516. The output of inverter 510 is input to an inverter 512 of master latch 502. The output of inverter 512 is input to an inverter 514 of slave latch 504, and the output of inverter 514 is input to inverter 516 of output portion 507. The output of inverter 516 is the output 518 of latch circuit 500. In one embodiment, output 518 may be input to another latch circuit, and so on, to form a chain or string of latch circuits.

In one example, first circuit portion 502 includes a first keeper device stack having two pFET (positive channel Field Effect Transistor) transistors 520a, 520b in series connected to a second keeper device stack having two nFET (negative channel Field Effect Transistor) transistors 522a, 522b in series. In one particular example, the two pFET transistors 520a, 520b in series are connected to the two nFET transistors 522a, 522b via a node 527, which is also connected to a node 540a at the output of inverter 512.

The gate of nFET 522a is connected, e.g., to a system clock, LCK 524, and the gate of pFET 520b is connected to the inverse of the system clock, LCKN 526. Gates of both transistors 520a and 522b are coupled to a node 541 (L1N), which is coupled to a node 543 that connects to a feedback inverter that drives the L1N node. The feedback inverter includes, for instance, a pFET 520c electronically connected in series to nFET 522c. The gates of both transistors 520c, 522c are connected to a node 540b, which is at an input to inverter 514 of second circuit portion 504.

As indicated above, first circuit portion 502 further includes inverter 512, which in this example is a tri-state inverter. The tri-state inverter 512 receives as a data input the output of inverter 510 and has control inputs (LCK, LCKN), which indicate the tri-state inverter is active when LCK is low (e.g., =0) and LCKN is high (e.g., =1).

In one example, second circuit portion 504 includes a first keeper device stack having two pFET transistors 530a, 530b in series connected in series to a second keeper device stack having two nFET transistors 532a, 532b in series. In one particular example, the two pFET transistors 530a, 530b in series are connected to the two nFET transistors 532a, 532b via a node 531, which is also connected to a node 542a at the output of inverter 514.

The gate of pFET 530b is connected to the system clock (LCK) 524, and the gate of nFET 532a is connected to the inverse of the system clock (LCKN) 526. Similarly, gates of both transistors 530a and 532b are coupled to a node 545 (L2), which is coupled to a node 547 that connects to a feedback inverter that drives the L2 node. The feedback inverter includes, for instance, a pFET 530c electrically connected to nFET 532c. The gates of both transistors 530c, 532c are connected to a node 542b at the input of inverter 516.

Second circuit portion 504 further includes inverter 514, which in this example is a tri-state inverter. The tri-state inverter 514 receives as a data input the output of inverter 512 and has control inputs (LCKN, LCK), which indicate the tri-state inverter is active when LCKN is low (e.g., =0) and LCK is high (e.g., =1).

As described above, first circuit portion 502, which is a master latch, includes tri-state inverter 512; a keeper device stack including a pFET stack having pFETs 520a, 520b and L1N and LCKN controls; a keeper device stack including an nFET stack having nFETs 522a, 522b and L1N and LCK controls; a feedback inverter driving the L1N node including transistors 520c, 522c; and the wires connecting those circuits together. Further, second circuit portion 504, which is a slave latch includes tri-state inverter 514; a keeper device stack including a pFET stack having pFETs 530a, 530b and L2 and LCK controls; a keeper device stack including an nFET stack having nFETs 532a, 532b and L2 and LCKN controls; a feedback inverter driving the L2 node including transistors 530c, 532c; and the wires connecting those circuits together.

Further, in accordance with an aspect of the present invention, latch circuit 500 includes a device 550a coupled thereto. For instance, device 550a is electrically connected to nodes 540b and 542a, in order to provide a short in the slave latch. In one particular example, device 550a includes a transistor 552a, such as an nFET transistor, and has a global control 560 (FLIP) used to assert a signal to short-out the slave latch. For instance, when the global control is asserted and assuming that LCK is low (and LCKN is high), tristate inverter 514 is, in effect, bypassed in that the value at L1 will be forced to be the same value as L2N; in effect, the L1 value is not inverted by inverter 514 (e.g., it was inverted when LCK was last high, but will now be inverted again when FLIP is asserted, resulting in the same value at L2N as at L1).

To facilitate short-circuiting of the latch circuit, another device 550b is used. In one example, device 550b is coupled (e.g., electrically connected) to first circuit portion 502 and second circuit portion 504. In one particular example, device 550b is an nFET transistor 552b coupled to the gate of nFET 532b at a node 544a of the slave latch and provides a signal input to inverter 512 at a node 544b of the master latch. Device 550b is used to weaken the force that holds up the signal on L2N, allowing device 550a to reliably flip the value.

Associated with devices 550a and 550b is a global control 560 (FLIP) used to change the value of the bit from the state it is in (e.g., 1 or 0) to the opposite state (e.g., 0 or 1).

In normal operation, flip global control 560 would be zero, so the two added nFETs would be off (i.e., non-conducting). However, if debugging is desired (e.g., stuck at fault is discovered), then the flip control is set to one. Normally, when the flip signal is asserted, the active clock (LCK) should be held low (e.g., 0). A string of constant data (e.g., zeros) is scanned through, then stopped and the FLIP is asserted. Note, in this example, LCK should be low, and LCKN should be high during this action, i.e., when FLIP is asserted. Therefore, in a chain of latches, a flush path is set up with each latch getting set to the inverse of the previous latch in the chain.

In one example, assume for this latch circuit, D=0, DN=1, L1=0, L2N=1 and Q=0. When the flip signal is asserted, it will short circuit tristate inverter 514 between L1 and L2N so the output at L2N is 0, instead of 1, and the state of Q will flip to be 1, instead of 0.

Figure 6A:
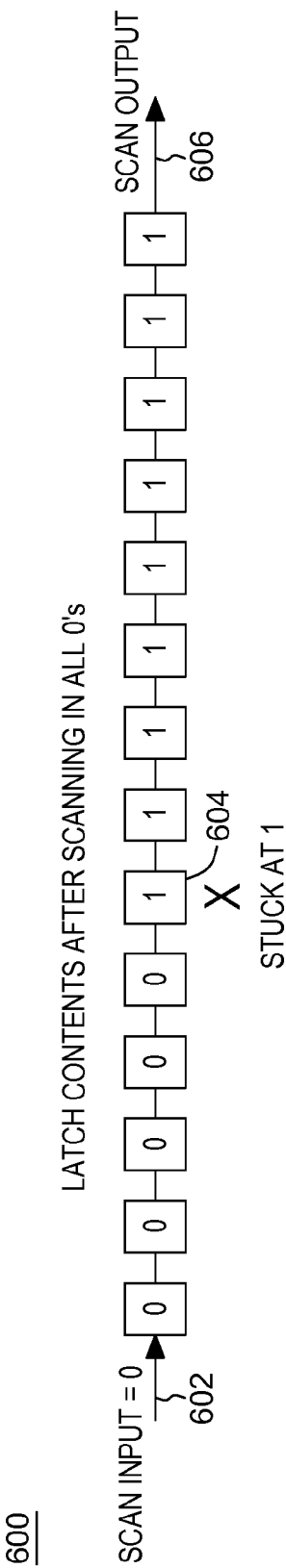
FIG. 6A depicts one example of latch contents after scanning in zeros, in accordance with one or more aspects.

One example of latch contents in a chain of latch circuits after scanning in all zeros is depicted in FIG. 6A. As shown, a scan chain 600 has an input 602 in which a zero is scanned in. However, one of the latch circuits is in error, so it outputs a one 604. Thereafter, the remainder of the latch circuits in the chain output a one, producing a scan output 606 of one. With this implementation, it is difficult to determine which latch circuit is in error. However, in contrast, in accordance with one or more aspects of the present invention, by using the flip device, determination of which latch circuit is in error is facilitated, as shown in FIG. 6B.

Figure 6B:
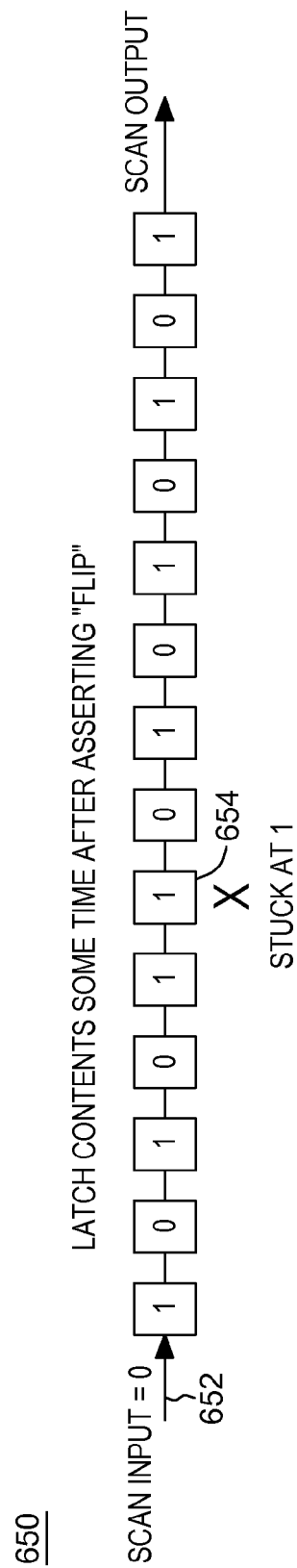
FIG. 6B depicts one example of latch contents after asserting the debug device of FIG. 5, in accordance with one or more aspects.

Referring to FIG. 6B, latch contents 650 of latch circuits of a latch chain after asserting the flip are depicted. As shown, a zero is input 652 to the scan chain; however, the flip is asserted and LCK is low, so alternating data is written into the chain of latches. When flip is deasserted, the latches can be scanned out to find the faulty latch 654. For instance, the data pattern at the output will be alternating 1 and 0 until the data from the stuck latch shows up at the output, after which only 1's will be observed. It can be readily observed that, if the broken latch 654 were instead stuck at 0 instead of 1, the circuitry would work in an identical fashion, except with alternating 0 and 1 up to the point where the observed data would be a constant stream of 0's, instead of 1's.

By employing the flip device and asserting the flip, output of latch 654 is a one instead of the expected zero, but the remaining outputs alternate between zero and one, as expected, thereby indicating that the error is at latch circuit 654.

Figure 7:
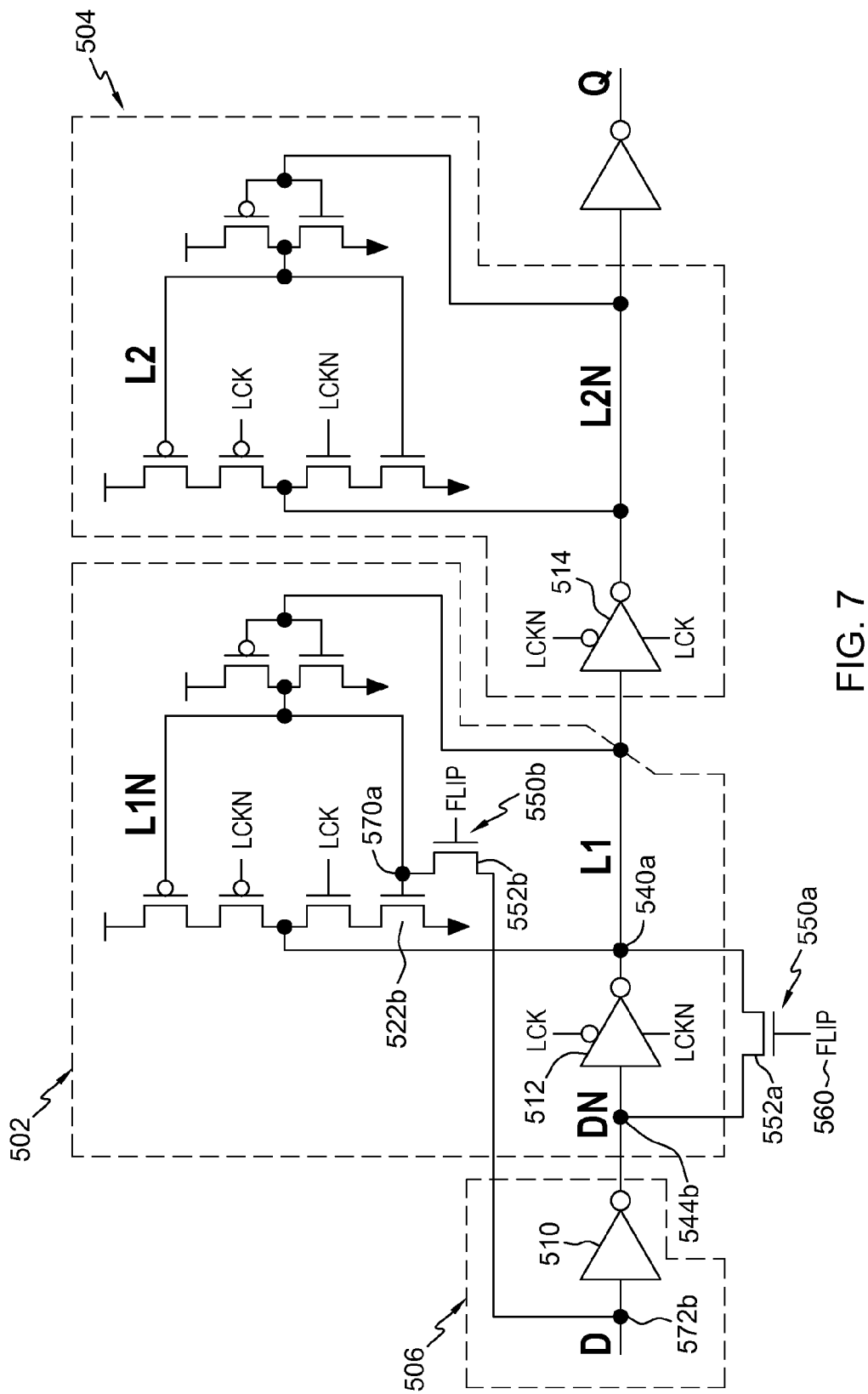
FIG. 7 depicts another example of a latch circuit including a device to debug the latch circuit, in accordance with one or more aspects.

In the above example, the flip device is used to flip the slave latch. However, in another example, the master latch may be flipped, as shown in FIG. 7. Referring to FIG. 7, device 550a is now coupled to nodes 540a, 544b of the master latch in order to short the master latch, instead of the slave latch. In particular, device 550a is electrically connected to the latch circuit to short inverter 512 of master latch 502. Additionally, in this example, device 550b is coupled to a gate of nFET 522b of first circuit portion 502 at a node 570a and to input portion 506 at a node 572b. In this implementation, the flip is asserted with the LCK signal high.

Figure 8:
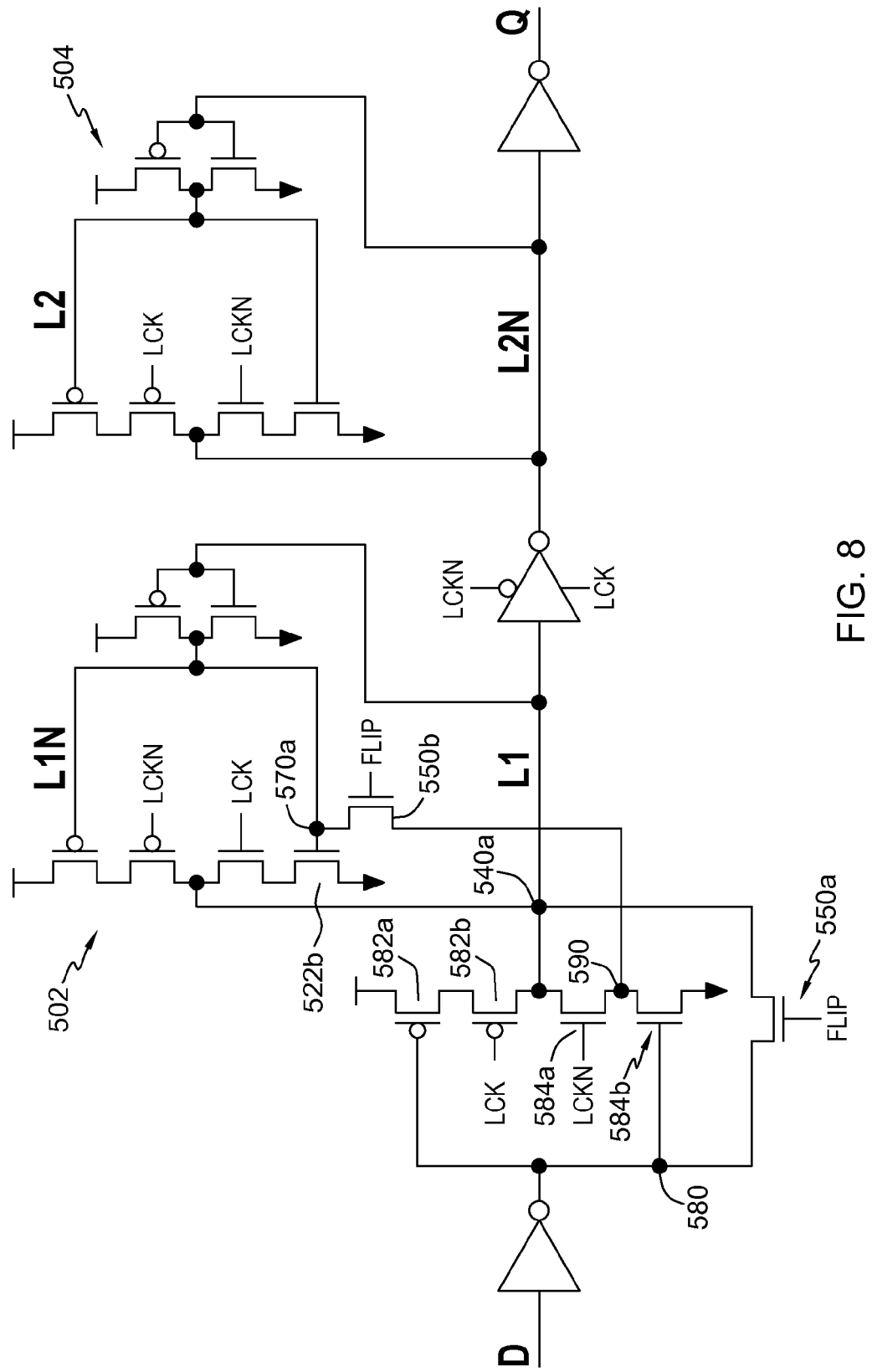
FIG. 8 depicts yet another example of a latch circuit including a device to debug the latch circuit, in accordance with one or more aspects.

Many other implementations of the debug capability are possible. For example, as shown in FIG. 8, device 550a is used to short the master latch, and in this example, is coupled to the latch circuit at nodes 540a and 580. In this particular implementation, the tri-state inverter of the master latch (e.g., inverter 512) is shown as having two pFET transistors 582a, 582b in series connected to two nFET transistors 584a, 584b in series, and device 550a is coupled to the gate of nFET 584b. Additionally, device 550b is coupled to first circuit portion 502 at node 570a, the gate of nFET 522b and to a node 590 between nFET 584a and nFET 584b. Again, in this example, the flip is asserted with the LCK signal high.

Figure 9:
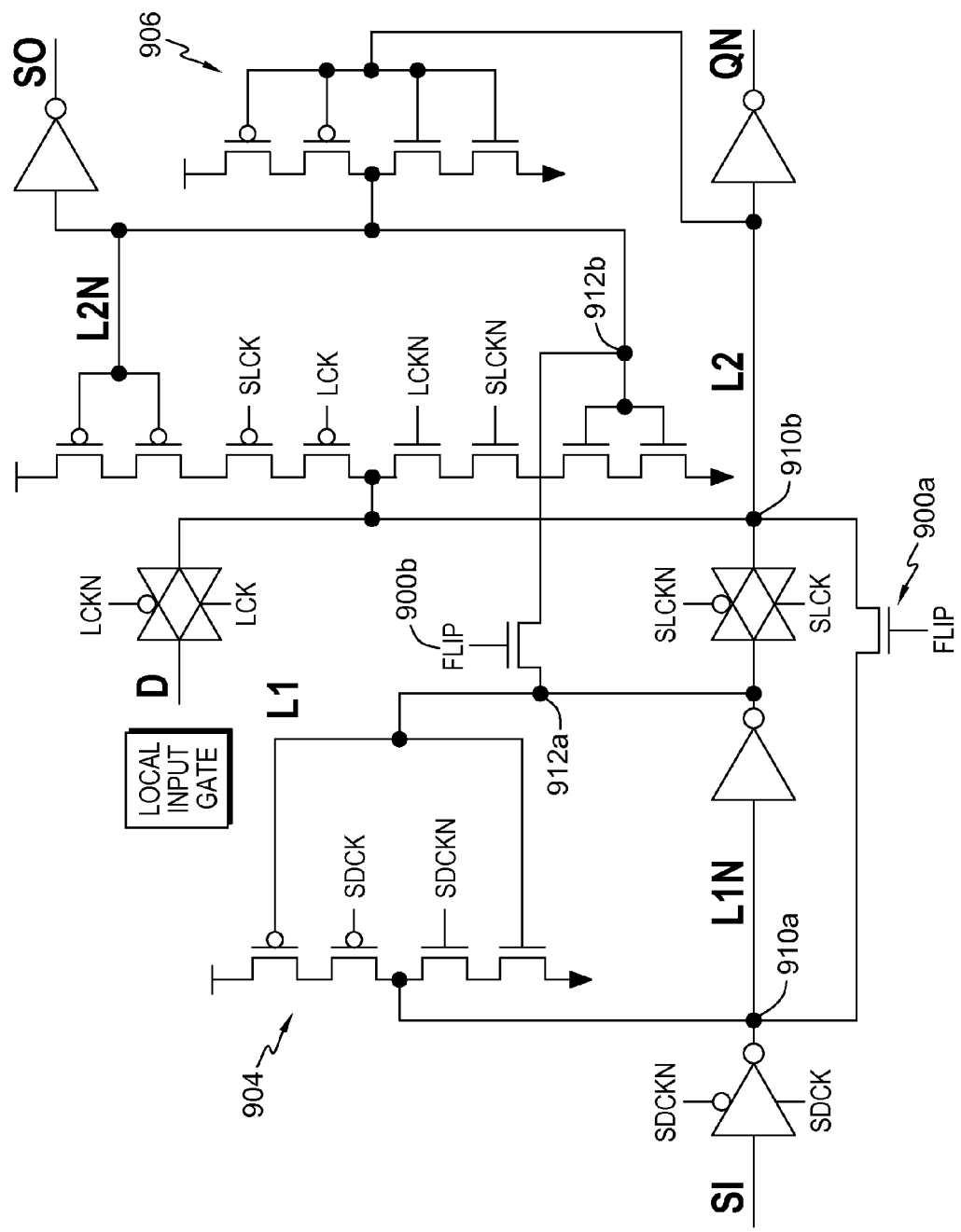
FIG. 9 depicts still another example of a latch circuit including a device to debug the latch circuit, in accordance with one or more aspects.

In yet a further embodiment, the same debugging technique may be used in a regular latch (pulsed or not) and the device may be used to short either the master latch or the slave latch. As shown in FIG. 9, a device 900a (similar to device 550a) is used to short a master latch 904. Device 900a is coupled to the latch circuit at nodes 910a, 910b. To facilitate the debugging, a device 900b (similar to device 550b) is used, which is coupled to master latch 904 at node 912a and slave latch 906 at node 912b. Many other variations are possible.

As described herein, in one or more aspects, devices (and an associated global control) are added to latch circuits to flip a latch state, i.e., to write the opposite state into the latch compared to what would be written, if the clock was activated. Various embodiments are described herein with reference to the figures. However, those skilled in the art will understand that many other variations are possible. The figures are not meant to be limiting, but to provide various examples to demonstrate aspects of the invention.

Figure 10:
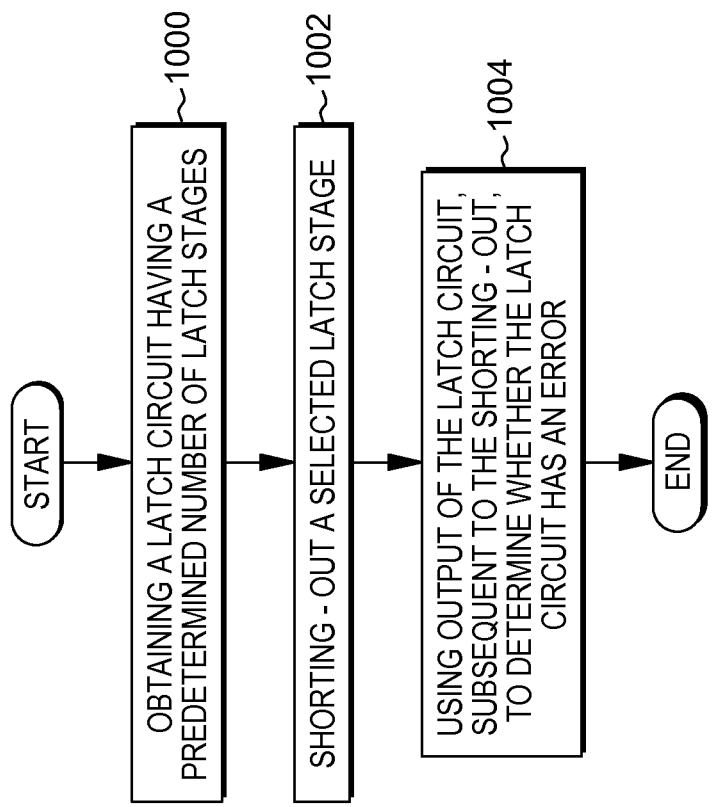
FIG. 10 depicts one embodiment of logic to debug a latch circuit, in accordance with one or more aspects.

In one aspect, a plurality of devices (e.g., transistors) is added to a latch circuit such that the state of the latch is reversed when the clock is inactive and a control signal is applied, compared to the state the latch would have assumed if its clock input had been activated. As described with reference to FIG. 10, in one embodiment, the debugging of latch circuits includes, for instance, obtaining a latch circuit having a predetermined number of latch stages (e.g., a master latch stage and a slave latch stage), STEP 1000; shorting-out a selected latch stage (e.g., the slave latch stage or the master latch stage) of the predetermined number of latch stages using, e.g., one or more devices (e.g., 550a, 550b), STEP 1002; and using output of the latch circuit, subsequent to the shorting-out, to determine whether the latch circuit has an error, STEP 1004.

One or more aspects do not rely on any feedback path, the flipping of the latch node is asynchronous, and do not require toggling of any clock signals. When the flip signal is asserted, the input data is passed through to the output of the latch, and inverted at the same time, with no feedback path back to the input. This inverted signal is then passed in turn on to the next latch, where it is inverted again and passed on to the next latch in the chain, continuing in that manner until all signals are stable, and each latch is then holding a value which is inverted from the value held by the previous latch in the chain. This all happens asynchronously when flip is asserted.

In one embodiment, flip latches are added to circuits for debug purposes to force a latch state when a latch has a stuck fault, permitting the latch to be mimicked in the scan chain by action of the flip latch.

In a further embodiment, the debug capability may be used to provide a low-overhead technique for performing a scan chain flush. To perform the flush, the slave (or master) clock is set high and the debug path is activated causing the entire scan chain to flush, with inversions at every master-slave pair.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Although various embodiments are described above, these are only examples. For example, other type of devices or other implementations of devices may be used without departing from the spirit of aspects of the present invention. Many variations are possible.

The terminology used herein is for the purpose of describing particular embodiments only and is not intended to be limiting. As used herein, the singular forms "a", "an" and "the" are intended to include the plural forms as well, unless the context clearly indicates otherwise. It will be further understood that the terms "comprises" and/or "comprising", when used in this specification, specify the presence of stated features, integers, steps, operations, elements, and/or components, but do not preclude the presence or addition of one or more other features, integers, steps, operations, elements, components and/or groups thereof.

The corresponding structures, materials, acts, and equivalents of all means or step plus function elements in the claims below, if any, are intended to include any structure, material, or act for performing the function in combination with other claimed elements as specifically claimed. The description of one or more embodiments has been presented for purposes of illustration and description, but is not intended to be exhaustive or limited to in the form disclosed. Many modifications and variations will be apparent to those of ordinary skill in the art. The embodiment was chosen and described in order to best explain various aspects and the practical application, and to enable others of ordinary skill in the art to understand various embodiments with various modifications as are suited to the particular use contemplated.

What is claimed is:

1. A circuit comprising:
    an input portion;
    a first circuit portion coupled to an output of the input portion;
    a second circuit portion coupled to the first circuit portion;
    an output portion coupled to an output of the second circuit portion;
    a device coupled to at least one of the first circuit portion and the second circuit portion to selectively provide a short in one of the first circuit portion and the second circuit portion, the short to provide a particular latch state, the particular latch state to be used to provide an output state at the output portion to be used in debugging the circuit; and wherein:
the first circuit portion comprises a master latch and the second circuit portion comprises a slave latch;
the device is positioned to short the slave latch; and
the slave latch comprises a tri-state inverter and the device is positioned to short the tri-state inverter of the slave latch, and wherein an output of the tri-state inverter of the slave latch is a same value as an input of the tri-state inverter of the master latch.

2. The circuit of claim 1, wherein the device comprises one transistor and a global control to control the one transistor.

* * * * *